US006472731B2

(12) United States Patent
Chew

(10) Patent No.: US 6,472,731 B2
(45) Date of Patent: Oct. 29, 2002

(54) SOLDER CLAD LEAD FRAME FOR ASSEMBLY OF SEMICONDUCTOR DEVICES AND METHOD

(75) Inventor: Chee Hiong Chew, Sembilan (MY)

(73) Assignee: Semiconductor Components Industries LLC, Phoenix, AZ (US)

( * ) Notice: Subject to any disclaimer, the term of this patent is extended or adjusted under 35 U.S.C. 154(b) by 0 days.

(21) Appl. No.: 09/728,388

(22) Filed: Dec. 4, 2000

(65) Prior Publication Data

US 2002/0066945 A1 Jun. 6, 2002

(51) Int. Cl.[7] .............................................. H01L 23/495
(52) U.S. Cl. ........................................ 257/676; 257/672
(58) Field of Search ................................. 257/676, 666, 257/672

(56) References Cited

U.S. PATENT DOCUMENTS 5,554,886 A * 9/1996 Song ........................... 257/666
6,118,174 A * 9/2000 Kim ............................ 257/676
6,133,624 A * 10/2000 Asada ......................... 257/668
6,150,709 A * 11/2000 Shin et al. ................... 257/666
2001/0050420 A1 * 12/2001 Yang ........................... 257/676

* cited by examiner

Primary Examiner—Phat X. Cao

(57) ABSTRACT

A lead frame for assembly of semiconductor devices allows the wireless bonding of a die thereto. The lead frame includes a plurality of conductive leads the near ends of which are arranged together in a predetermined pattern that defines the die mounting area. The near end of one of the plurality of conductive leads is extended to extend inwardly of the die mounting area and is stamped to produce a stepped down portion with respect to the remaining end portion thereof. The near ends of the plurality of conductive leads, as well as, the remaining near end portion of lead having the stepped down portion are solder clad. In the assembly process, solder paste is dispensed onto the stepped down portion and the die is placed on the near ends of the conductive leads. The solder paste holds the die in place prior to reflow of the solder clad.

8 Claims, 1 Drawing Sheet

SOLDER CLAD LEAD FRAME FOR ASSEMBLY OF SEMICONDUCTOR DEVICES AND METHOD

FIELD OF THE INVENTION

The present invention relates to semiconductor devices in general and, more particularly, to a lead frame and method for assembly of micro-series semiconductor packages while providing maximum die bonding area.

BACKGROUND OF THE INVENTION

Thin small outline semiconductor packages such as TSOP, MSOP, and the SCxx package (manufactured by ON Semiconductor) are well known in the art of micro-series semiconductor packaging. Typical in the art is the TSOP 5 package, which generally consists of a five, leaded lead frame having a semiconductor die bonded onto a flag. The flag makes up one of the five leads extending externally from the package. Wire bonds connect the remaining leads to the inputs/outputs of the circuit comprising the die. Molded plastic encapsulates the lead frame to finish the package.

Because wire bonding is utilized in the prior art TSOP packaging techniques, the die mounting area (the aforementioned flag) is limited in size. This is due mainly because of the need to wire bond from the remaining conductive leads to the inputs/outputs of the circuitry comprising the semiconductor die. Hence, the size of the die used in such packages is limited.

Additionally, the die size is limitation mentioned above also limits the power specifications for the die. Thus, the smaller flag, as well as, the smaller die size that can be used reduces the heat dissipation capabilities of such packages. Thus, minimal power devices can only be used in such micro-series semiconductor packages.

Accordingly, a need exists for a lead frame structure and method of wireless bonding permitting maximum die bonding in micro-series semiconductor packaging. The lead frame structure and method should be an inexpensive process for the manufacture of TSOP plastic molded semiconductor package and allow for the semiconductor die size to be maximized to the edge of the interior dimensions of the package.

DETAILED DESCRIPTION OF THE DRAWINGS

The invention is embodied in a semiconductor lead frame primarily used in the manufacture of semiconductor devices in a micro-series type of packages to permit the maximum die size to be placed in the package. By maximizing the die size, more device functionalities and/or heat can be dissipated by the package to allow higher power circuits to be utilized in smaller packages. As will be later described in detail, the lead frame structure of the present invention eliminates the need of wire bonding between the semiconductor die and the conductive leads of the lead frame structure.

Figure 1:
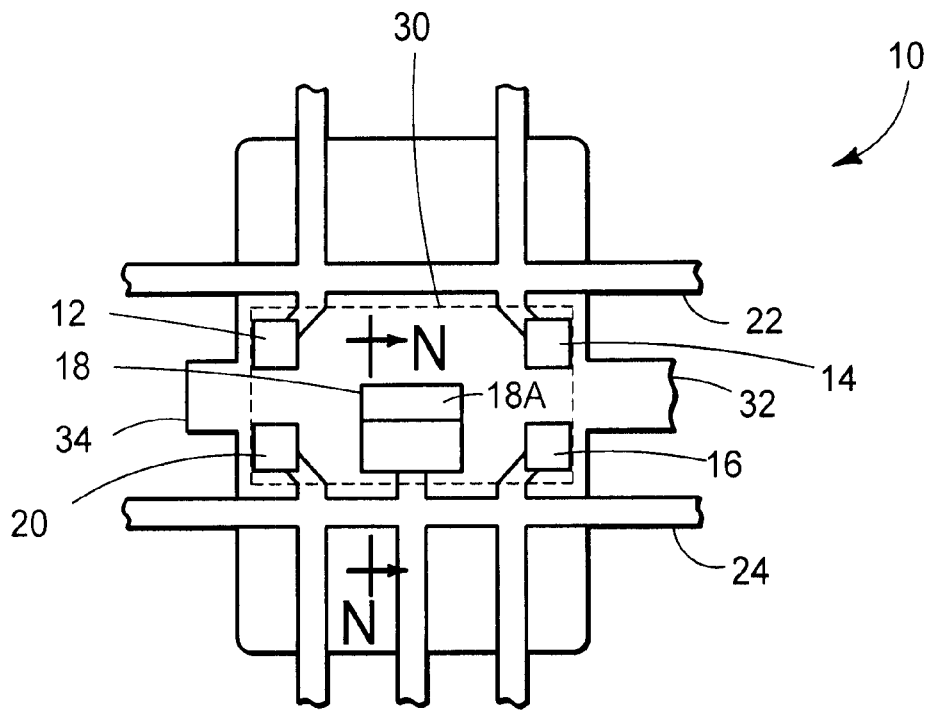
FIG. 1 illustrates a plan view of the lead frame structure of the preferred embodiment.

Turning now to FIG. 1, there is shown lead frame structure 10 of the present invention. Lead frame 10 is exaggerated in size for ease of description purposes. For discussion purposes, lead frame 10 is shown as having five conductive leads 12, 14, 16, 18, and 20. It is understood that more or less conductive leads may be utilized as desired for lead frame 10. Metallic members or tie bars 22 and 24 are used to stabilize lead frame 10 during the manufacturing process and are conventional. During final manufacturing, tie bars 22 and 24 are removed in a known manner. Dashed outline 30 represents the semiconductor die and illustrates that die 30 is maximized to the internal dimensions of lead frame 10. End tabs 32 and 34 stabilize lead frame 10 and are removed during final process of the package. As will be more clearly shown in FIG. 2, the near ends of leads 12 through 20, are spatially formed with respect to one another internally to the outside dimension of the package comprising lead frame 10. The darker shaded portions of the near ends of leads 12 through 20 signify that these portions are solder clad with a eutectic of lead-tin. The near end of lead 18 is comprised of first and second portions with the first portion being at the same level as the other leads 12, 14, and 16. The second portion 18A of lead 18 is down-formed with respect to the first portion thereof and is not solder clad.

Figure 2:
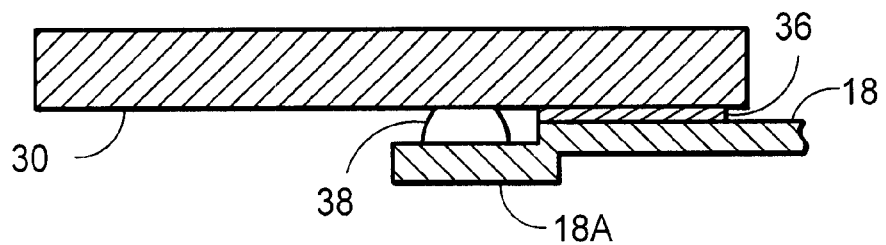
FIG. 2 illustrates an exaggerated cross-sectional view of the lead frame structure of FIG. 1 showing a semiconductor die placed thereupon in accordance with the present invention.

As more clearly seen in FIG. 2, wherein the same reference numerals are used to denote the same members of FIG. 1, down-formed portion 18A of lead 18 is at a lower level with respect to the first portion thereof. Lead portion 18A is established by use of a stamping tool. Lead portion 18A provides an area for a solder paste 38 to be deposited thereon as shown. Solder paste 38 is of the same material as the solder clad 36 of near ends of leads 12 through 20.

In the assembly process, once the solder paste 38 is deposited onto area 18A, die 30 is flipped over so that its active circuitry and the input/outputs align with the solder clad near ends of leads 12 through 20. Solder paste 38 holds die 30 to lead frame 10 prior to the reflow process step. The reflow process step typically occurs at a temperature between 200 and 400 degrees Celsius. At the reflow step, the solder clad lead portions adhere to the input/output pads of die 30 thereby holding the die 30 to lead frame 10. Simultaneously, solder paste 38 wicks onto lead portion 18A. Thus, as described, lead frame structure 10 provides a method for bonding a semiconductor die thereto the area of the latter being maximized to area of the package while not requiring wire bonds.

In summary, a novel lead frame structure and method of assembly of a semiconductor die thereto has been disclosed. The method of attaching the semiconductor die to the lead frame structure does not require wire bonding and permits maximizing the die size to the package dimensions encapsulating the lead frame structure and die. The low cost lead frame structure enables the die to sit on the near ends of the leads during the reflow process step through the combination of solder paste and solder clad.

What is claimed is:

1. A lead frame for the assembly of semiconductor devices comprising:

a plurality of conductive leads, the near ends of each being arranged in a predetermined pattern defining a die mounting area for attaching a semiconductor die thereto, at least one of said plurality of conductive leads having an extended near end portion extending inwardly into the die mounting area, said extended near end portion being stepped down to a lower level than the remaining portion of its near end such that an under-formed excess area is provided; and a conductive paste deposited in the extended near end portion for electrically contacting the semiconductor die.

2. The lead frame of claim 1 wherein said near ends of said plurality of leads include the remaining portion of said near end of said at least one of said plurality of conductive leads being solder clad.

3. A lead frame comprising:

a plurality of conductive leads, the near ends of each being arranged in a predetermined pattern defining a die mounting area for attaching a semiconductor die thereto, at least one of said plurality of conductive leads having an extended near end portion extending inwardly into the die mounting area, said extended near end portion being stepped down to a lower level than the remaining portion of its near end such that an under-formed excess area is provided, wherein said near ends of said plurality of leads include the remaining portion of said near end of said at least one of said plurality of conductive leads being solder clad, wherein said stepped down near end portion of said at least one of said plurality of leads is suited to receive solder paste thereon such that the semiconductor die is held in place prior to the final assembly of the semiconductor device.

4. A semiconductor lead frame comprising:

a plurality of semiconductor device leads, the near ends of which being aligned in a predetermined pattern to form a die mounting area, a first connecting tie bar attached to first group of said plurality of device leads in proximity to said near ends thereof, a second tie bar attached to second group of said plurality of said device leads in proximity to said near ends thereof, said first and second tie bars holding said first and second groups of said plurality of device leads in alignment at substantially the same level, one of said second group of said plurality of device leads having an extended near end portion extending inwardly into said die mounting area, said extended near end portion being downward formed such that lies at a level below the level of said aligned near ends of said plurality of device leads; and a solder paste deposited in the extended near end portion for electrically contacting a semiconductor die.

5. The semiconductor lead frame of claim 4 wherein at least two of said aligned near ends of said plurality of device leads are solder clad.

6. The semiconductor lead frame of claim 4 wherein said aligned near ends of said plurality of device leads are solder clad.

7. A semiconductor lead frame comprising:

a plurality of semiconductor device leads, the near ends of which being aligned in a predetermined pattern to form a die mounting area, a first connecting tie bar attached to first group of said plurality of device leads in proximity to said near ends thereof, a second tie bar attached to second group of said plurality of said device leads in proximity to said near ends thereof, said first and second tie bars holding said first and second groups of said plurality of device leads in alignment at substantially the same level, one of said second group of said plurality of device leads having an extended near end portion extending inwardly into said die mounting area, said extended near end portion being downward formed such that such that lies at a level below the level of said aligned near ends of said plurality of device leads, wherein at least two of said aligned near ends of said plurality of device leads is solder clad, wherein said aligned near ends of said plurality of device leads is solder clad, wherein said downward formed near end portion forms an under excess area acceptable to receive solder paste thereupon.

8. The semiconductor lead frame of claim 7 having a semiconductor die mounted on said aligned near ends of said plurality of device leads, said semiconductor die being held in place on said aligned near ends of said plurality of device leads by said solder paste.

* * * * *